United States Patent
Matsuoka

(10) Patent No.: US 8,639,067 B2
(45) Date of Patent: Jan. 28, 2014

(54) FABRICATION METHOD OF OPTICAL WIRING BOARD AND OPTICAL PRINTED CIRCUIT BOARD

(75) Inventor: Yasunobu Matsuoka, Hachioji (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 469 days.

(21) Appl. No.: 12/866,180

(22) PCT Filed: Jan. 14, 2009

(86) PCT No.: PCT/JP2009/000103
§ 371 (c)(1),
(2), (4) Date: Nov. 18, 2010

(87) PCT Pub. No.: WO2009/098834
PCT Pub. Date: Aug. 13, 2009

(65) Prior Publication Data
US 2011/0052118 A1    Mar. 3, 2011

(30) Foreign Application Priority Data
Feb. 8, 2008   (JP) .................. 2008-028652

(51) Int. Cl.
*G02B 6/12* (2006.01)
(52) U.S. Cl.
USPC ............. 385/14; 385/31; 385/39; 385/131
(58) Field of Classification Search
None
See application file for complete search history.

(56) References Cited

U.S. PATENT DOCUMENTS

| | | | | |
|---|---|---|---|---|
| 4,966,430 A * | 10/1990 | Weidel | | 385/14 |
| 5,394,490 A * | 2/1995 | Kato et al. | | 385/14 |
| 5,416,861 A * | 5/1995 | Koh et al. | | 385/14 |
| 5,761,350 A * | 6/1998 | Koh | | 385/14 |
| 5,999,670 A | 12/1999 | Yoshimura et al. | | |
| 7,680,367 B2 | 3/2010 | Matsuoka et al. | | |
| 7,991,248 B2 * | 8/2011 | Matsuoka et al. | | 385/14 |
| 2002/0061154 A1 * | 5/2002 | Tsukamoto et al. | | 385/14 |
| 2002/0097962 A1 * | 7/2002 | Yoshimura et al. | | 385/50 |

(Continued)

FOREIGN PATENT DOCUMENTS

| | | |
|---|---|---|
| EP | 1 020 748 A1 | 7/2000 |
| JP | 4-333004 A | 11/1992 |

(Continued)

OTHER PUBLICATIONS

International Search Report Including English translation dated Mar. 10, 2009 (Four (4) pages).

(Continued)

*Primary Examiner* — Mike Stahl
(74) *Attorney, Agent, or Firm* — Crowell & Moring LLP

(57) ABSTRACT

The fabrication of an optical wiring board is performed in the following manner: A core member 13 for a mirror 22 is pattern-formed on a clad layer 11, and simultaneously, using the core member 13, each alignment mark pattern 14 is formed at any position on the clad layer 11. Further, with positioning in reference to each alignment mark 14, the core pattern 13 is subjected to physical cutting to form a bevel part and a concave part 23. Then, a metallic reflective film 18 is coated on the surface of the bevel part. Thereafter, with positioning in reference to each alignment mark 14, an optical wiring core pattern 20 is formed on the clad layer 11 adjacently to the mirror 22.

6 Claims, 7 Drawing Sheets

(56) References Cited

U.S. PATENT DOCUMENTS

| | | |
|---|---|---|
| 2003/0081877 A1* | 5/2003 | Nakata et al. .................. 385/14 |
| 2006/0110114 A1* | 5/2006 | Yanagisawa et al. ......... 385/129 |
| 2009/0003761 A1 | 1/2009 | Matsuoka et al. |
| 2009/0080830 A1 | 3/2009 | Matsuoka et al. |

FOREIGN PATENT DOCUMENTS

| | | | |
|---|---|---|---|
| JP | 7-191236 A | * | 7/1995 |
| JP | 10-300961 A | | 11/1998 |
| JP | 2000-98153 A | * | 4/2000 |
| JP | 2003-50329 A | | 2/2003 |
| JP | 2003-167158 A | | 6/2003 |
| JP | 3748528 B2 | | 12/2005 |
| JP | 2007-10859 A | | 1/2007 |
| KR | 10-0736641 B1 | | 7/2007 |
| WO | WO 99/17142 A1 | | 4/1999 |
| WO | WO 2006/054569 A1 | | 5/2006 |
| WO | WO 2008/035466 A1 | | 3/2008 |

OTHER PUBLICATIONS

Korean Office Action dated Sep. 26, 2011 with English Translation (thirteen (13) pages).

Japanese Office Action with English translation dated Nov. 6, 2012 (seven (7) pages).

Taiwanese Office Action with English translation dated Oct. 12, 2012 (twenty-two pages).

Japanese-language Office Action with partial English translation dated Aug. 6, 2013 (6 pages).

* cited by examiner

FABRICATION METHOD OF OPTICAL WIRING BOARD AND OPTICAL PRINTED CIRCUIT BOARD

TECHNICAL FIELD

The present invention relates to a fabrication method of an optical wiring board and an optical printed circuit board. More particularly, the present invention relates to a fabrication method for forming an optical wiring part and an optical coupling part on an optical wiring board to be used for high-speed optical signaling in chip-to-chip or board-to-board signal transmission/reception inside such equipment as a transmission unit, and also relates to an optical printed circuit board capable of processing transmitted/received optical signals collectively on the board.

BACKGROUND ART

Recently, in the field of information and telecommunications, optical communication traffic infrastructures have been built up rapidly for enabling high-speed transmission of massive data, i.e., fiber-optic networks have been implemented in backbone and metro-access network systems for communications over relatively long distances of the order of kilometers. Henceforth, it will be advantageous to implement signal wiring opticalization even for short-distance communications such as rack-to-rack transmission (over a distance of the order of meters to hundreds of meters) and intra-rack transmission (over a distance of the order of centimeters to tens of centimeters) for the purpose of processing massive data without delay.

As regards signal wiring opticalization inside equipment, in a transmission unit such as a router/switch, for example, a high-frequency signal transmitted from an external network such as an Ethernet system through an optical fiber is input to a line card. On one backplane, plural line cards are provided, and a signal input to each line card such as mentioned above is collected to a switch card via the backplane. Then, after the input signal is subjected to processing by an LSI in the switch card, an output signal is furnished to each line card via the backplane again. Where this kind of operation is performed in conventional equipment, a signal having a transfer rate of 300 Gbits/s or higher is collected to the switch card via the backplane. For transmission thereof through use of conventional electrical wiring, it is required to provide divisions each corresponding to a transfer rate of approximately 1 to 3 Gbits/s per wiring line in consideration of propagation loss, i.e., it is required to use at least 100 wiring lines.

Further, it is necessary to provide a pre-emphasis/equalizer circuit for a high-frequency signal transmission line or to provide a countermeasure against reflection or crosstalk between wiring lines. In a technical trend toward still larger capacities of equipment systems for processing information at a higher transfer rate of the order of Tbits/s, the use of conventional electrical wiring will give rise to problematic requirements for a significant increase in the number of wiring lines and effective countermeasures against crosstalk or the like. As a solution to these requirements, it is desired to opticalize signal transmission lines for signaling through a line card, a backplane, and a switch card in equipment, for signaling between boards, and for signaling between chips on a board. Thus, high-frequency signal propagation can be made at a transfer rate of 10 Gbits/s or higher, thereby advantageously contributing to a decrease in the number of transmission lines and elimination of the necessity for above-mentioned countermeasures for high-frequency signal transmission.

For implementation of high-speed optical interconnection circuits that are applicable to signal transmission in equipment, an optical printed circuit board featuring excellent performance and high component mountability must be fabricated at low cost. In Patent Document 1 indicated below, there is disclosed an exemplary embodiment of a high-speed optical interconnection circuit wherein a multilayered optical waveguide array is used to provide optical coupling with a photonic device array at a high level of wiring density. The configuration of this optical interconnection circuit is shown in FIG. 7. In this example, each of optical wiring layer 101A and 101B includes an optical waveguide array having a plurality of lines in a two-dimensional form, and these optical wiring layers are stacked multilayeredly in the direction of board thickness. On the surface of the board, a surface-emitting (surface-sensitive) photonic device array 100 is mounted so as to provide optical coupling. This arrangement is advantageous in that a high level of wiring density is attainable on a smaller mounting area. Further, regarding a mirror part 106 that reflects an optical beam propagating through the optical waveguide array perpendicularly with respect to the board, the end faces of optical waveguide arrays 101A and 101B are disposed in line. Thus, plural cores can be formed simultaneously by cutting or the like, contributing to simplification in the fabrication process step concerned.

Further, in Patent Document 2 indicated below, there is disclosed an exemplary embodiment of an optical interconnection circuit wherein an optical wiring layer and a beam reflection mirror member are formed in an integral structure. In this example, a board having electrical wiring is included, an optical wiring layer is formed to have a core and a clad disposed on at least one face of the board, and a mirror member is embedded between the board and the optical wiring layer to provide an optical-electrical wiring board. This board is produced by a fabrication method including the following steps; disposing a mirror member on a board, and forming an optical wiring layer so as to cover the mirror member disposed on the board. Since the mirror member is disposed on the optical wiring board and the optical wiring layer is so formed as to cover the mirror member, it is allowed to dispose the mirror member at any position on the board, i.e., a mounting layout can be arranged flexibly. Besides, by preparing a mirror member as a separate part and mounting the prepared mirror member on the board, it is possible to obviate degradation in board fabrication yield relevant to a mirror forming process.

Patent Document 1:
 Japanese Patent No. 3748528
Patent Document 2:
 Japanese Patent Application Laid-Open Publication No. 2003-50329

DISCLOSURE OF THE INVENTION

Problems to be Solved by the Invention

In a fabrication method of a multilayered optical waveguide array disclosed in the Patent Document 1, each optical waveguide of an optical wiring part is tapered by cutting or the like, and attached with adhesive or the like to provide a multilayered stack form. In this case, it is difficult to mount each optical waveguide prepared as a separate part with a high degree of positional accuracy on the order of micrometers for satisfying requirements for high-efficiency optical coupling with an optical device, and also the number of processes is increased to cause intricacy in fabrication. Regarding the mirror part that reflects an optical beam propagating through the optical waveguide at an angle of 90° for optical coupling with an optical device on the optical waveguide, a reverse-tapered shape is formed with respect to the top face of the optical waveguide so that optical reflection is made using a refractive index difference between the core of the optical waveguide and ambient air. In this structure, since cavities are produced on the surface of the mirror, there arises difficulty in reliability assurance due to adhesion of foreign substances or deformation attributable to thermal expansion.

In a fabrication method and structure disclosed in the Patent Document 2 wherein the mirror member prepared as a separate part is mounted on the board and embedded with the optical waveguide, it is also difficult to mount each mirror prepared as a separate part with a high degree of positional accuracy on the order of micrometers, and the number of component parts and the number of processes are increased to cause an increase in fabrication cycle time. For optical reflection with high efficiency, the mirror member made of a metallic material must be used. In this case, a core exfoliation may occur due to a difference with respect to the linear expansion coefficient of an organic optical waveguide material for embedding the mirror member or due to poor adherence on a metallic interface, resulting in degradation in fabrication yield or reliability.

It is therefore an object of the present invention to provide a fabrication method for forming a mirror and an optical wiring core easily with a high degree of relative positional accuracy on the order of micrometers while preventing degradation in reliability and performance due to adhesion of foreign substances or deformation attributable to thermal expansion.

More specifically, it is an object of the present invention to provide a fabrication method wherein, in fabrication of an optical wiring board to be used for high-speed optical signaling in chip-to-chip or board-to-board signal transmission/reception inside such equipment as a transmission unit, an optical wiring part and an optical coupling part are formed with a high degree of positional accuracy and at a high level of fabrication yield while reducing the number of component parts and simplifying fabrication processes, and to provide an optical printed circuit board having an optical wiring part and an optical coupling structure for enabling low-loss optical coupling of optical signals in transmission/reception.

Means of Solving the Problems

For addressing the above-mentioned problems, the present invention provides the following fabrication method: In the fabrication of an optical printed circuit board having a laminated structure where an optical waveguide layer is formed to include an optical wiring core that is surrounded by a clad layer and is made of a material having a higher refractive index than that of the clad layer and where a mirror is formed in the optical waveguide layer for reflecting an input/output optical beam relevant to an optical device perpendicularly with respect to the board to provide optical coupling with the optical wiring core, a mirror core member is pattern-formed on the clad layer, and simultaneously plural alignment mark patterns are formed at any positions on the clad layer by using the material of the mirror core member. Further, with positioning in reference to the alignment mark patterns, the core pattern is subjected to physical cutting to form a bevel part and a concave part. Then, a metallic reflective film is coated on the surface of the bevel part. Thereafter, with positioning in reference to the alignment mark patterns, an optical wiring core pattern is formed on the clad layer adjacently to the mirror.

Further, the lamination and processing of the clad layer, the mirror part, and the optical wiring core over the board are repeated to form a multilayered structure in a sequential buildup fashion. A photosensitive polymer material is used for each of the clad, the mirror core member, and the optical wiring core, and the core pattern is formed by lithography using an ultraviolet beam. Still further, in a fabrication process step, on each side of the mirror core pattern formed on the clad layer, the bevel part is formed in a forward tapered shape with respect to parallelism to the board by dicing with a metal blade or the like.

Furthermore, there is provided an optical printed circuit board wherein, on the top face of the optical waveguide layer, each optical device array is mounted at a position just above the mirror, wherein the mirror is formed of the clad layer, the core member disposed on the clad layer, the bevel part having a tapered shape with respect to parallelism to the board as related to at least one face of the core member on the clad layer, the concave part formed on the clad layer, and the metallic reflective film coated on the surface of the bevel part; and wherein the optical wiring core is disposed on the clad layer isolatedly from the mirror and the concave part thereof.

Effects of the Invention

According to the fabrication method of the present invention, through lithography in which the alignment mark patterns are formed simultaneously with the formation of the mirror, it is possible to ensure easily a high degree of relative positional accuracy on the order of micrometers for the mirror and the optical wiring core.

Further, the mirror is formed in a forward tapered shape with respect to the top face of the optical waveguide, the surface of the mirror is metal-coated, and the mirror part is completely covered with the clad so that no cavities are provided. Thus, it is possible to prevent degradation in reliability and performance due to adhesion of foreign substances or deformation attributable to thermal expansion.

As described above and according to the present invention, it is possible to provide a fabrication method wherein, in fabrication of an optical wiring board to be used for high-speed optical signaling in chip-to-chip or board-to-board signal transmission/reception inside such equipment as a transmission unit, an optical wiring part and an optical coupling part are formed with a high degree of positional accuracy and at a high level of fabrication yield while reducing the number of component parts and simplifying fabrication processes, and to provide an optical printed circuit board having an optical wiring part and an optical coupling structure for enabling low-loss optical coupling of optical signals in transmission/reception.

BEST MODE FOR CARRYING OUT THE INVENTION

The following describes in detail the exemplary embodiments of the present invention.

First Embodiment

FIGS. 1A to 1G are explanatory diagrams concerning a fabrication method of an optical wiring board according a first embodiment of the present invention.

FIG. 1A shows a state in which a clad layer 11 having a thickness of approximately 30 µm is formed over a board 10, and further over the clad layer 11, a core member 12 having a higher refractive index than that of the clad layer 11 and having a thickness of approximately 50 µm is formed by coating or lamination.

In this example, as a material of a board, there is used a glass epoxy resin that is commonly employed for printed circuit boards, and as a material of each of the clad layer 11 and the core member 12, there is used a photosensitive polymer resin that can be hardened by applying an ultraviolet (UV) beam to allow photo-lithography patterning in consideration of facilitation of fabrication processes and affinity for the board material.

Then, as shown in FIG. 1B, the core member 12 formed over the clad layer 11 is subjected to photo-lithography using a patterned photomask 15a. Thus, a core pattern 13 having a rectangular parallelepiped shape is formed through exposure and development processes. In this step of fabrication, simultaneously with the formation of the core pattern, plural alignment mark patterns 14 are also formed at any positions (at four corner positions in this example) by photo-lithography of the material of the core member 12. While photo-lithography using the photomask 15a is adopted here for forming the core pattern, direct-writing lithography without using a photomask may also be employed as another fabrication technique for core pattern formation in a similar fashion.

Then, as shown in FIG. 1C, each of the longitudinal side faces of the rectangular-parallelepiped core pattern 13 is processed by dicing with a metal blade to form a mirror 22 having a bevel part on each longitudinal side face thereof. In this step of fabrication, by performing deep-cutting with the tip of the metal blade, the bevel part is formed on a gradient area ranging from the core member 13 of the mirror 22 to the clad layer 11. In the process of cutting, a concave part 23 is also formed on the clad layer 11 simultaneously. Instead of the dicing mentioned above, physical processing with high-power laser exposure may also be employed as another technique for forming the bevel part.

Further, as shown in FIG. 1D, on the surface of the mirror 22, a metallic reflective film 18 for optical reflection is coated by using a shadow mask 15b in a manner similar to the photo-lithography mentioned above. For positioning the shadow mask 15b, the alignment mark patterns 14 formed in the step of photo-lithography described with reference to FIG. 1B are used. Regarding the metallic film, Cr and Au are laminated so that Au is provided on a reflective surface side. The metallic film is coated to cover a surface area ranging from the top face of the mirror 22 and to the surface of the concave part 23.

Then, as shown in FIG. 1E, a core member 19 made of a material similar to that of the mirror 22 is coated or laminated over the mirror 22.

Then, in a manner similar to the procedure described with reference to FIG. 1B, the core member 19 is subjected to photo-lithography using a patterned photomask 15c. Thus, plural optical wiring core patterns 20 are formed on the board simultaneously through exposure and development processes. For positioning the photomask 15c, the alignment mark patterns 14 are also used.

In this step of fabrication, if the optical wiring core pattern 20 is in direct contact with the metallic reflective film 18 coated on the mirror 22, there may arise a problem that fabrication yield or reliability is degraded due to exfoliation caused by poor adherence on a metallic film interface. Further, if the core pattern is formed on the concave part 23, a stepped part may be produced on the optical wiring core, causing an increase in excess loss due to scattering or radiation of an optical beam propagating through the core. To prevent these problematic conditions, the optical wiring core pattern 20 is disposed isolatedly from the mirror 22, i.e., the optical wiring core pattern 20 is disposed on a clad layer position apart from the concave part 23 of the mirror. As in the fabrication method of the present invention, by forming the optical wiring core pattern through photo-lithography after forming the mirror 22, it is possible to provide the above-mentioned structure easily with a high degree of positional accuracy.

In the last step of fabrication, as shown in FIG. 1G, a clad material 21 is coated or laminated over the mirror 22 and the optical wiring core patterns 20. The clad layer 21 should have a thickness of 80 µm. While the entire structure including the board 10 is warmed slightly to soften the material of the clad layer 21, a pressure is applied to the top of the entire structure by using a flat-surface pressure plate. Thus, the clad layer 11 is forced to fill in spaces around the mirror 22 and the optical wiring core patterns 20, and an optical waveguide layer 25 (including the clad layer 11, the optical wiring core pattern 20, and the clad layer 21) is so formed as to surround each optical wiring core pattern 20. While the fabrication method has been described here as related to a single-layered optical wiring board, the fabrication of a multilayered optical wiring board can also be accomplished by repeating the procedures described with reference to FIGS. 1A to 1G.

That is, multilayered optical wiring formation can be made through consistent board fabrication processes by repeating the lamination and processing of a clad layer, a mirror part, and an optical wiring core on a board in a sequential buildup fashion according to the above-mentioned fabrication method. Hence, the fabrication method according to the first preferred embodiment of the present invention is also advantageous in multilayered wiring arrangements since the number of component parts and the number of fabrication processes can be reduced significantly.

Second Embodiment

FIG. 2 include a perspective view of an optical printed circuit board according to a second embodiment of the present invention, and a sectional view of the optical printed circuit board.

In this structure, a first clad layer 11 is formed over a board 10, and further over the first clad layer 11, plural optical wiring core patterns 20 are laminated by using a material having a higher refractive index than that of the first clad layer 11. Still further, an optical waveguide layer 25 including a second clad layer 21 is so formed as to surround each of the optical wiring core patterns 20. On the top face of the optical waveguide layer 25, there are formed plural electrical wiring lines 30 respectively. On pads of the electrical wiring lines 30, a laser diode 31 and a photodiode 32 are mounted by flip-chip bonding to provide electrical coupling via a solder part 33. Further, in the optical waveguide layer 25, a mirror 22 is formed so that input/output optical beams relevant to the laser diode 31 and the photodiode 32 are reflected perpendicularly with respect to the board to provide optical coupling with each optical wiring core pattern 20. The mirror 22 includes the clad layer 11, a core member 13 disposed thereon, a bevel part formed on a gradient area ranging from the core member 13 to the clad layer 11, a metallic reflective film 18 formed thereon, and a concave part 23 on the clad layer 11.

Further, plural optical wiring core patterns 20 made of a material similar to that of the core member 13 of the mirror are disposed on the clad layer isolatedly from the concave part 23 of the mirror. In this structure, it is possible to suppress or prevent misalignment and interfacial exfoliation due to a difference in the coefficient of expansion between the mirror 22 and the optical wiring core pattern 20 as aforementioned. The bevel part of the mirror 22 is formed down to the clad layer 11 disposed under the core member 13, i.e., a reflective part is formed down to a position lower than the optical wiring core. Thus, excess loss due to broadening of a core emission light beam can be suppressed. As the laser diode 31 and the photodiode 32 in this structure, it is preferable to use a vertical cavity surface-emitting laser (VCSEL) diode and a surface-sensitive photodiode that are suitable for flip-chip surface mounting.

Third Embodiment

FIG. 3 is a sectional view of an optical printed circuit board according to a third embodiment of the present invention. Differently from the structure described with reference to FIG. 2, the thickness of a core member of a mirror bevel part is larger than the thickness of an optical wiring core in the structure exemplified in the third embodiment. More specifically, in the structure shown in FIG. 3, the thickness "b" of a mirror 22 (70 to 80 μm in this example) is larger than the thickness "a" of an optical wiring core 20 (50 μm in this example). Thus, excess loss due to broadening of a core emission light beam can be suppressed as mentioned above.

Further, even if the light emission center axis of a laser diode 31 deviates from the mirror center axis in dependence upon mounting accuracy, light introduction into the core is ensured with a high probability since the optical reflection area of the mirror 22 is larger than the cross-sectional area of the optical wiring core 20. Thus, the misalignment tolerance of the laser diode 31 can be increased. Further, with respect to optical coupling between the optical wiring core 20 and a photodiode 32, this structure is also advantageous in that the misalignment tolerance of the photodiode can be increased similarly to the case described above. The gradient angle θ of the bevel part of the mirror 22 should preferably be within a tolerance range of ±2° based on a center angle of 45° with respect to parallelism to the board for the purpose of ensuring highly efficient optical coupling between each optical device and the mirror.

Fourth Embodiment

FIG. 4 is a sectional view of an optical printed circuit board according to a fourth embodiment of the present invention. In the fourth embodiment, there are included a bevel part 42 formed on one face of a mirror 22, an optical wiring core 20a that is optically coupled via the bevel part 42 to a laser diode 31 mounted on an optical waveguide layer 25, a bevel part 43 formed on a mirror face opposed to the bevel part 42, and an optical wiring core 20b that is optically coupled via the bevel part 43 to photodiode 32 mounted on the optical waveguide layer 25. In this structure, the optical wiring core 20a and the optical wiring core 20b are disposed in a fashion that a distance "d1" from the center of the bevel part 42 of the mirror to the end face of the optical wiring core 20a is different from a distance "d2" from the center of the bevel part 43 of the mirror to the end face of the optical wiring core 20b.

In a case where the laser diode 31 and the photodiode 32 are incorporated in a package 40 as shown in FIG. 4, a distance between each optical device and the mirror increases depending on the sizes of the package 40 and a solder part 33. In this case, for suppressing optical loss due to beam broadening, it is necessary to provide condenser lenses 41 and 42 on the optical wiring board or in the package. Since an optimum optical distance differs between transmitting and receiving sides, it is advantageous to form each optical wiring core at a position near a focal point of each of the condenser lenses 41 and 42 as shown in FIG. 4. In another technique, it is possible to provide an arrangement wherein the condenser lenses 41 and 42 having different curvatures are used while the distances "d1" and "d2" are equal to each other. However, this arrangement causes an increase in both the number of component parts and the number of fabrication processes. According to the fourth embodiment, the optical wiring cores 20a and 20b having different distances "d1" and "d2" respectively as shown in FIG. 4 can be formed through a single process of photo-lithography by using the fabrication method described with reference to FIGS. 1A to 1G.

Fifth Embodiment

FIG. 5 is a sectional view of an optical printed circuit board according to a fifth embodiment of the present invention. As shown in FIG. 5, an optical fiber array 51 having a connector 52 is mounted on the top face of an optical waveguide layer 25, and an input/output optical signal fed through an optical fiber 50 is subjected to beam reflection via a mirror 22 for optical coupling with an optical wiring core on the board. On the basis of this structure of the fifth embodiment, the present invention is also applicable to a passive optical circuit that provides optical coupling between an optical waveguide and an optical fiber as shown in FIG. 5.

Sixth Embodiment

FIG. 6 is a sectional view of an optical printed circuit board according to a sixth embodiment of the present invention. In the structure shown in FIG. 6, an optical waveguide layer 25 is formed over a multilayered optical wiring board 10, and an optical beam emitted from a laser diode 31 mounted on the optical waveguide layer 25 is fed to an optical fiber array 51 having a connector 52 mounted on the optical waveguide layer 25 for optical coupling through a mirror 22a, an optical wiring core 20a, and a mirror 22b. On the other hand, a similar arrangement is made for optical beam reception. As optical wiring on the optical waveguide layer 25, an optical waveguide 62 including an optical wiring core 20c and a mirror 22c may be used as shown in FIG. 6. Further, adjacently to the laser diode 31 and a photodiode 32, there is mounted an integrated circuit 60 incorporating a circuit for driving each optical device, a crossbar switch, a logic circuit, and so forth. Still further, each optical device and the integrated circuit 60 are coupled to each other through high-frequency electrical wiring 30 formed on the optical waveguide layer.

Furthermore, electrical wiring 61 including a power supply line and a ground line for the integrated circuit 60 is so incorporated as to provide coupling with a board 10 through the optical waveguide layer 25. According to the structure of the fifth embodiment, it is possible to provide an optical printed circuit board featuring a smaller mounting area and a high level of wiring density.

INDUSTRIAL APPLICABILITY

The present invention makes it possible to provide a fabrication method for forming an optical wiring part and an optical coupling part on an optical wiring board to be used for high-speed optical signaling in chip-to-chip or board-to-board signal transmission/reception inside such equipment as

EXPLANATION OF REFERENCE NUMERALS AND SYMBOLS

Figure 1A:
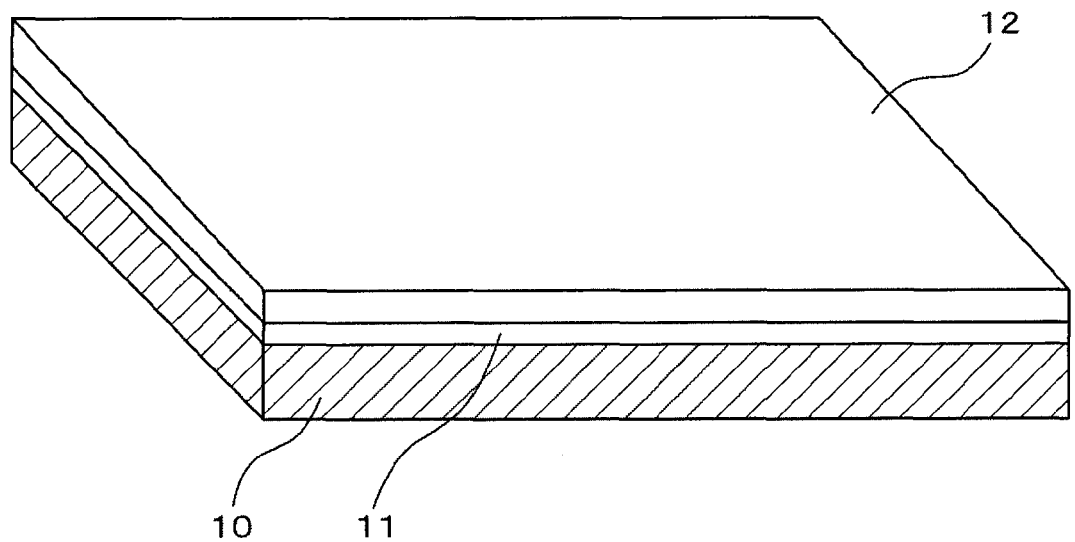
FIG. 1A is an explanatory diagram concerning a fabrication method of an optical wiring board according to a first embodiment of the present invention.
Figure 1B:
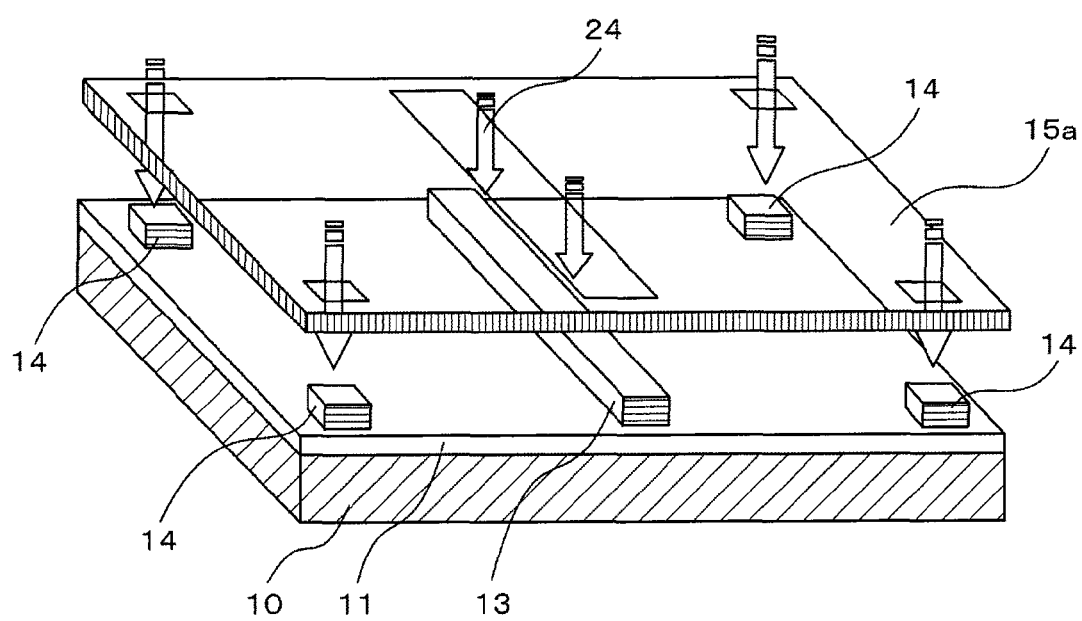
FIG. 1B is an explanatory diagram concerning the fabrication method of the optical wiring board according to the first embodiment of the present invention.
Figure 1C:
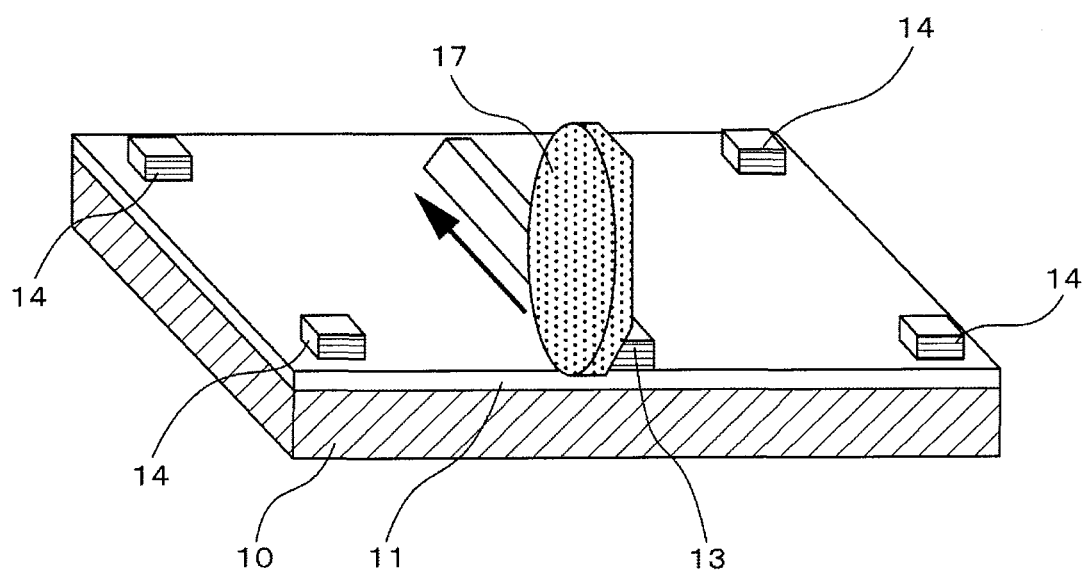
FIG. 1C is an explanatory diagram concerning the fabrication method of the optical wiring board according to the first embodiment of the present invention.
Figure 1D:
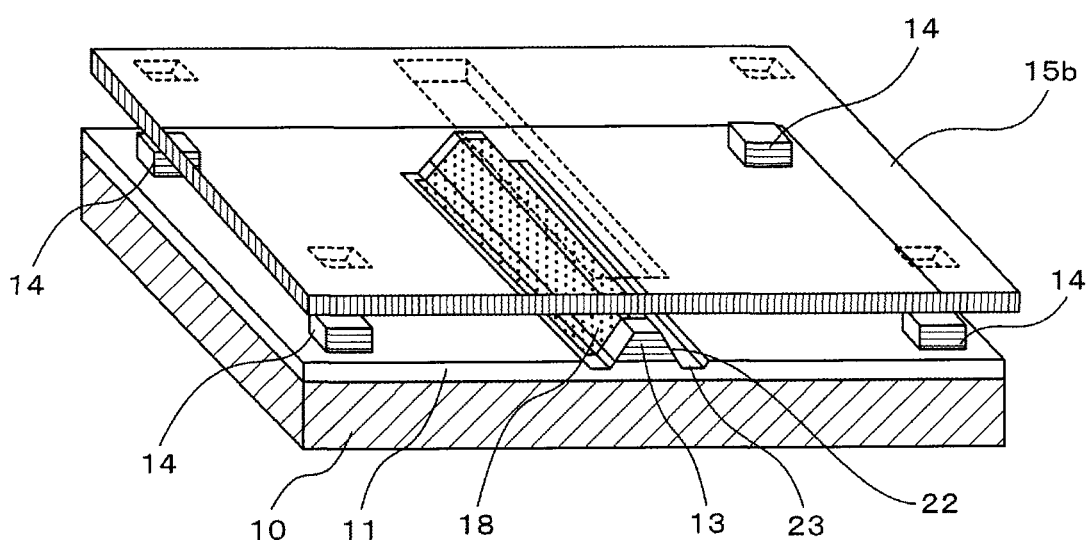
FIG. 1D is an explanatory diagram concerning the fabrication method of the optical wiring board according to the first embodiment of the present invention.
Figure 1E:
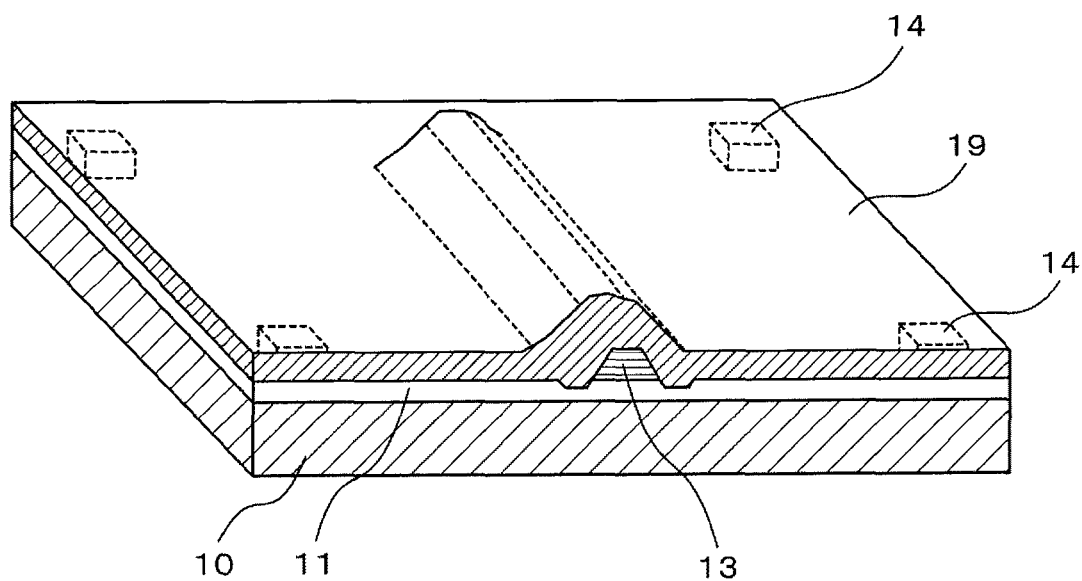
FIG. 1E is an explanatory diagram concerning the fabrication method of the optical wiring board according to the first embodiment of the present invention.
Figure 1F:
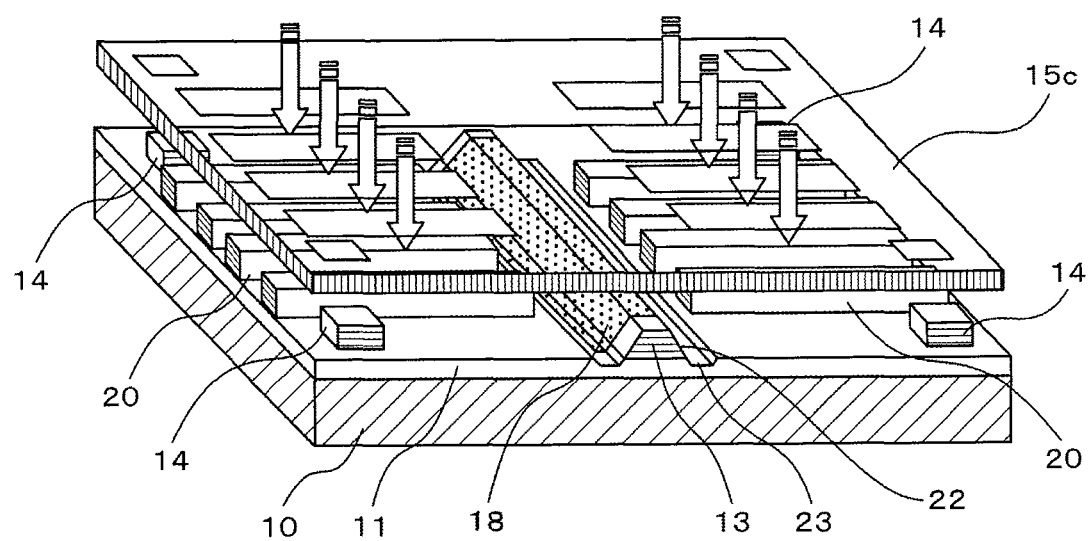
FIG. 1F is an explanatory diagram concerning the fabrication method of the optical wiring board according to the first embodiment of the present invention.
Figure 1G:
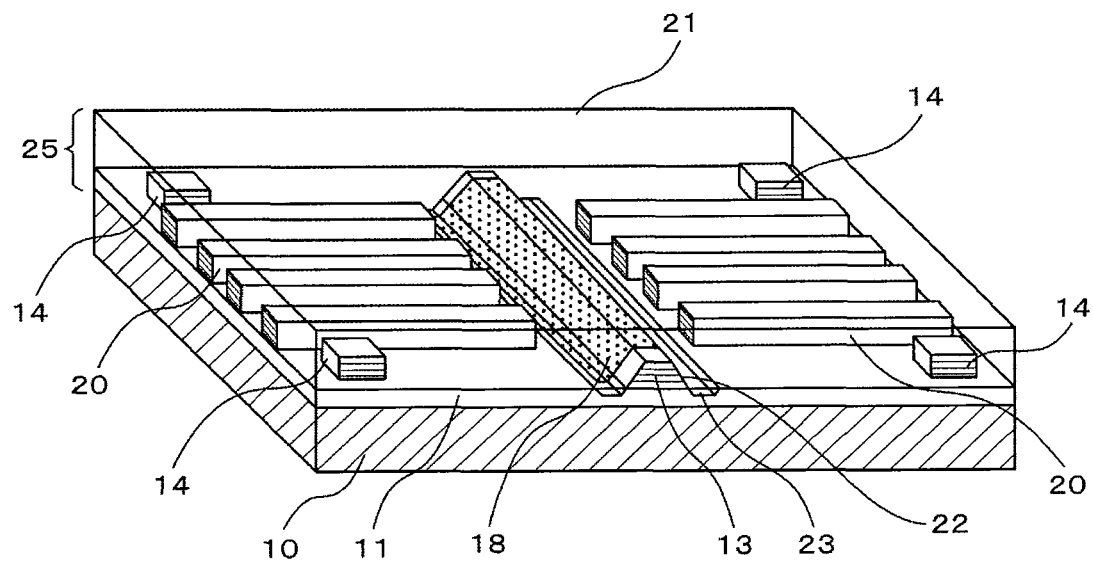
FIG. 1G is an explanatory diagram concerning the fabrication method of the optical wiring board according to the first embodiment of the present invention.
Figure 2A:
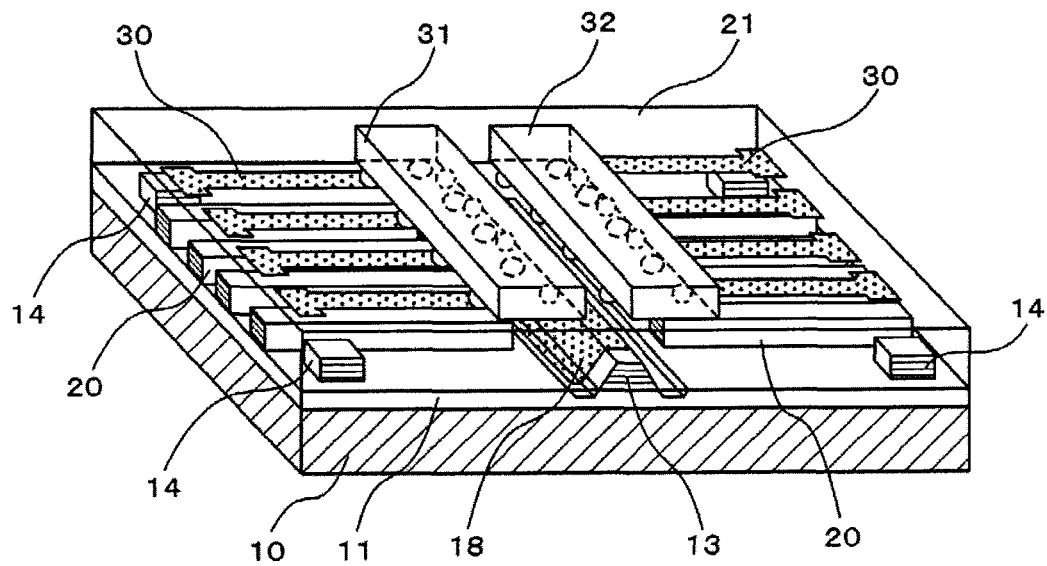
FIG. 2A is a perspective view of an optical printed circuit board according to a second embodiment of the present invention.
Figure 2B:
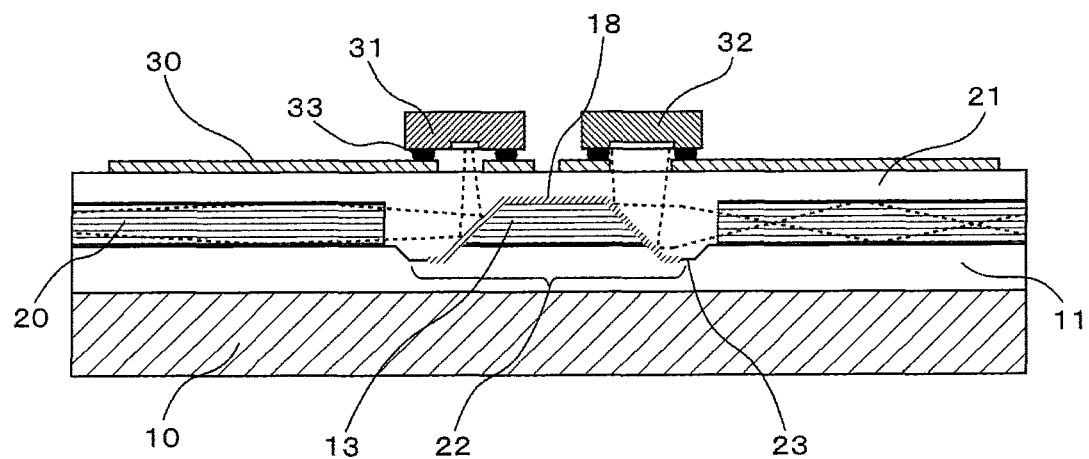
FIG. 2B is a sectional view of FIG. 2A.
Figure 3:
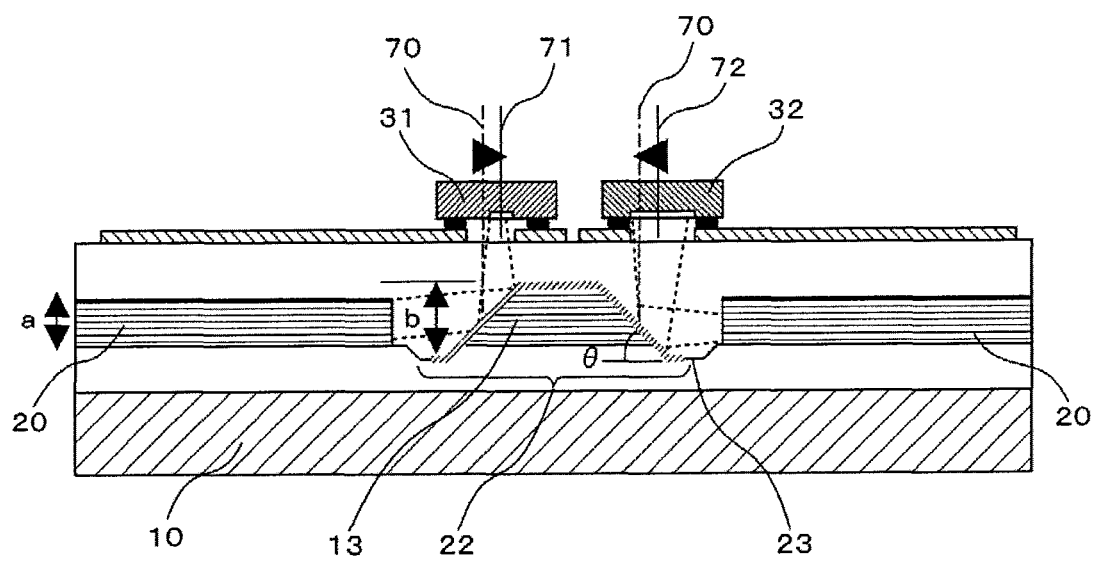
FIG. 3 is a sectional view of an optical printed circuit board wherein the thickness of a core member of a mirror bevel part is larger than the thickness of an optical wiring core according to a third embodiment of the present invention.
Figure 4:
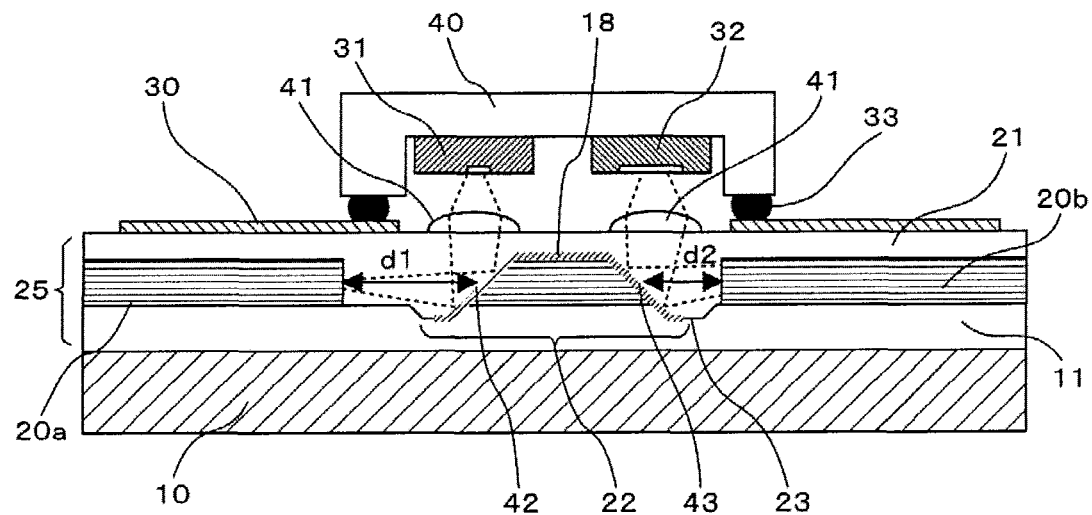
FIG. 4 is a sectional view of an optical printed circuit board according to a fourth embodiment of the present invention.
Figure 5:
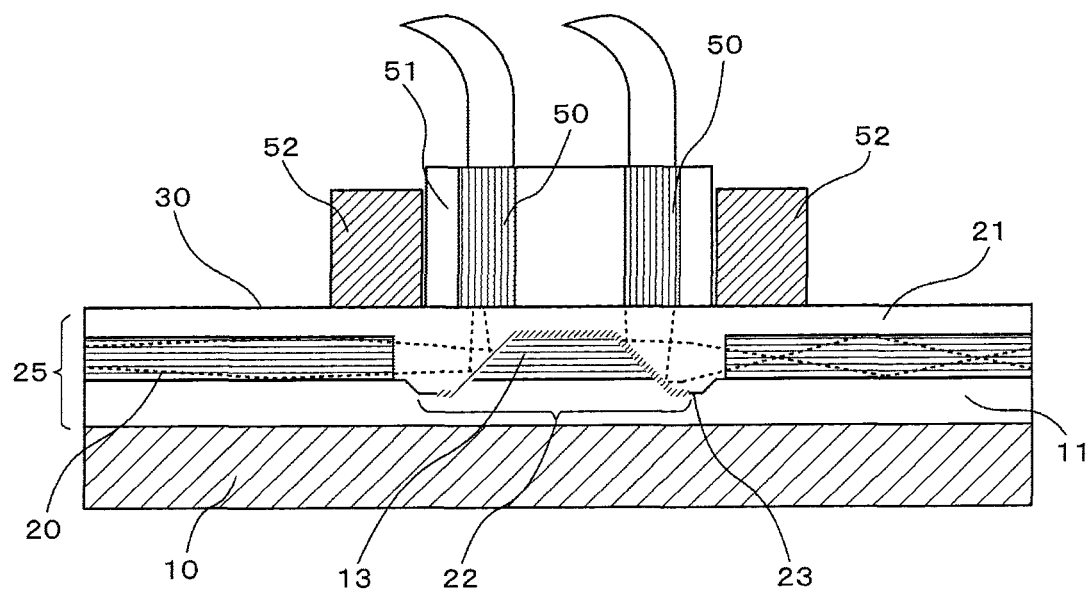
FIG. 5 is a sectional view of an optical printed circuit board wherein an optical fiber array having a connector is mounted on the top face of an optical waveguide layer according to a fifth embodiment of the present invention.
Figure 6:
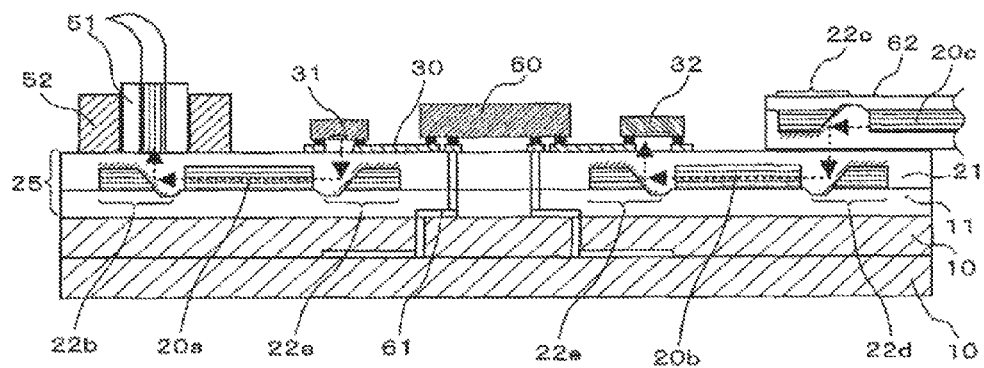
FIG. 6 is a sectional view of an optical printed circuit board according to the fifth embodiment of the present invention.
Figure 7:
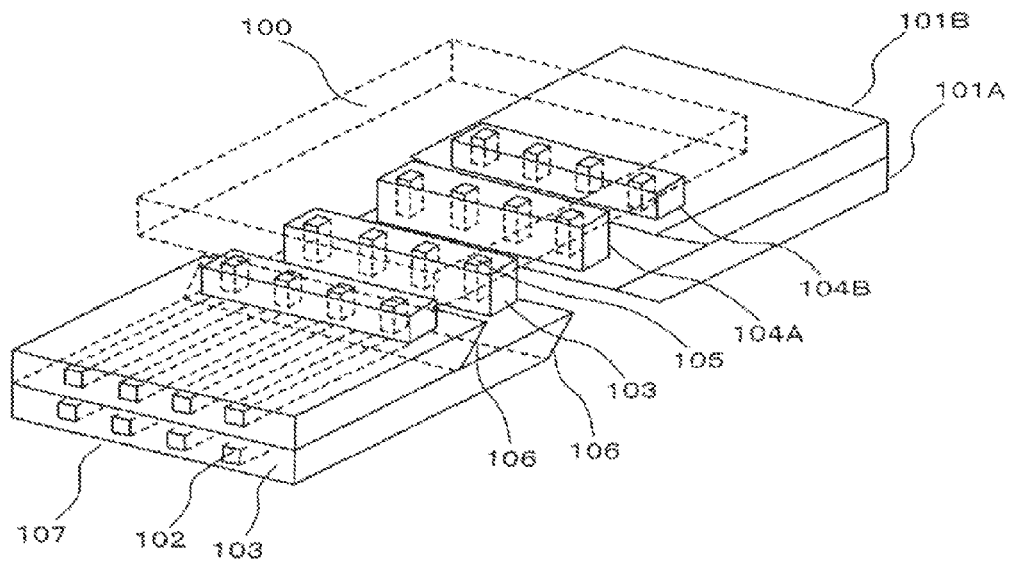
FIG. 7 is a diagram showing a conventional example of an optical interconnection circuit configuration wherein a multilayered optical waveguide array is used to provide optical coupling with a photonic device array at a high level of wiring density.

10 ... Board, 11, 21 ... Clad layer, 12, 19 ... Core member, 13 ... Core pattern, 14 ... Alignment mark pattern, 15a, 15c ... Photomask, 15b ... Shadow mask, 17 ... Metal blade, 18 ... Metallic reflective film, 20, 20a, 20b, 20c ... Optical wiring core pattern, 22, 22a, 22b, 22c, 22d, 22e ... Mirror, 23 ... Concave part, 24 ... Ultraviolet beam, 25 ... Optical waveguide layer, 30, 61 ... Electrical wiring, 31 ... Laser diode, 32 ... Photodiode, 40 ... Package, 41 ... Condenser lens, 42, 43 ... Bevel part, 50 ... Optical fiber, 51 ... Optical fiber array, 52 ... Connector, 60 ... Integrated circuit, 62 ... Optical waveguide, 70 ... Mirror center axis, 71 ... Light emission center axis, 72 ... Light reception center axis, 100 ... Array-type photonic device unit, 101A, 101B ... Array-type optical waveguide unit, 104A, 104B ... Array-type optical waveguide unit for optical coupling, 105 ... Core (Optical waveguide for optical coupling), 107 ... End face of optical waveguide

The invention claimed is:

1. A fabrication method of an optical wiring board, comprising:
   preparing a board;
   forming a first clad layer on the board, and further over the first clad layer, laminating a first core member made of a material having a higher refractive index than that of the first clad layer;
   processing the first core member through use of a mask having a desired pattern to form a plurality of alignment mark patterns and a mirror core pattern on the first clad layer;
   while positioning with the board in reference to the alignment mark patterns, forming a bevel part on each side of the mirror core pattern by cutting or laser processing, and also forming a concave part on the surface of the first clad layer so that the concave part is disposed in contact with the bevel part;
   forming a mirror part by selectively coating a metallic reflective film on an area including the bevel part of the mirror core pattern through use of a mask having a desired pattern;
   laminating a second core member over the board;
   while positioning with the board in reference to the alignment mark patterns, processing the second core member through use of a mask having a desired pattern to form an optical wiring core pattern on the first clad layer adjacently to the mirror core pattern so that the optical wiring core pattern is disposed perpendicularly with respect to the mirror core pattern; and
   forming a second clad layer over an area including the mirror part and the optical wiring core pattern so as to provide an optical waveguide layer including the first clad layer, the optical wiring core pattern, and the second clad layer.

2. The fabrication method of an optical wiring board according to claim 1,
   wherein the lamination and processing of the first clad layer, the first core member, the second core member, and the second clad layer over the board are repeated to form the mirror part and the optical wiring core pattern in a sequential buildup method.

3. The fabrication method of an optical wiring board according to claim 1,
   wherein a photosensitive polymer material is used for each of the first clad layer, the first core member, and the second core member; and wherein the mirror core pattern and the optical wiring core pattern are formed by lithography using an ultraviolet beam.

4. The fabrication method of an optical wiring board according to claim 2,
   wherein, on each side of the mirror core pattern, the bevel part is formed in a forward tapered shape with respect to the surface of the board by dicing or laser beam exposure.

5. An optical printed circuit board, comprising:
   a board;
   an optical waveguide layer including a first clad layer formed over the board, an optical wiring core layer that is formed over the first clad layer and is made of a material having a higher refractive index than that of the first clad layer, and a second clad layer formed over the optical wiring core layer; and an optical device array mounted on the optical waveguide layer;

wherein, in the optical waveguide layer, there are provided a mirror core pattern having a mirror part that reflects an input/output optical beam relevant to an external circuit or the optical device in a different direction with respect to the plane of the board, and an optical wiring core pattern that transmits an input optical beam to the mirror part or an output optical beam from the mirror part;

wherein each of the mirror core pattern and the optical wiring core pattern is made of a material that forms the optical wiring core layer;

wherein the mirror part is provided with a bevel part formed in a configuration that each side of the mirror core pattern has a forward tapered shape with respect to the surface of the board, and a metallic film is coated on the surface of the bevel part;

wherein, on the first clad layer, a concave part is disposed adjacently to the mirror part;

wherein the optical wiring core pattern is disposed on the first clad layer isolatedly from the mirror part and the concave part;

wherein a bevel part 1 is provided on one side face of the mirror core pattern, a bevel part 2 is provided on the other side face thereof opposed to the bevel part 1, a first optical wiring core pattern is disposed at a position facing the bevel part 1, and a second optical wiring core pattern is disposed at a position facing the bevel part 2; and wherein, given that the shortest distance from the center of the bevel part 1 to the end face of the first optical wiring core pattern is denoted as "d1", and that the shortest distance from the center of the bevel part 2 to the end face of the second optical wiring core pattern is denoted as "d2", there is a difference between the "d1" and "d2".

6. An optical printed circuit board, comprising:

a board;

an optical waveguide layer including a first clad layer formed over the board, an optical wiring core layer that is formed over the first clad layer and is made of a material having a higher refractive index than that of the first clad layer, and a second clad layer formed over the optical wiring core layer; and an optical device array mounted on the optical waveguide layer;

wherein, in the optical waveguide layer, there are provided a mirror core pattern having a mirror part that reflects an input/output optical beam relevant to an external circuit or the optical device in a different direction with respect to the plane of the board, and an optical wiring core pattern that transmits an input optical beam to the mirror part or an output optical beam from the mirror part;

wherein each of the mirror core pattern and the optical wiring core pattern is made of a material that forms the optical wiring core layer;

wherein the mirror part is provided with a bevel part formed in a configuration that each side of the mirror core pattern has a forward tapered shape with respect to the surface of the board, and a metallic film is coated on the surface of the bevel part;

wherein, on the first clad layer, a concave part is disposed adjacently to the mirror part;

wherein the optical wiring core pattern is disposed on the first clad layer isolatedly from the mirror part and the concave part; and wherein the optical device array comprises an optical fiber having a connector.

* * * * *